US007432169B2

(12) United States Patent
Kagamihara

(10) Patent No.: US 7,432,169 B2
(45) Date of Patent: Oct. 7, 2008

(54) METHOD FOR MANUFACTURING SEMICONDUCTOR DEVICE

(75) Inventor: Masaki Kagamihara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/766,162

(22) Filed: Jun. 21, 2007

(65) Prior Publication Data

US 2007/0298577 A1 Dec. 27, 2007

(30) Foreign Application Priority Data

Jun. 22, 2006 (JP) ............................. 2006-172813

(51) Int. Cl.
*H01L 21/331* (2006.01)
(52) U.S. Cl. .................... 438/309; 438/336; 438/361; 257/E29.114
(58) Field of Classification Search ......... 438/309–377, 438/202–205; 257/E29.114
See application file for complete search history.

(56) References Cited

U.S. PATENT DOCUMENTS

2007/0145531 A1* 6/2007 Sung .......................... 257/565

FOREIGN PATENT DOCUMENTS

| JP | 11-017040 | 1/1999 |
|----|-----------|--------|
| JP | 11-265953 | 9/1999 |

\* cited by examiner

*Primary Examiner*—H. Jey Tsai
(74) *Attorney, Agent, or Firm*—Young & Thompson

(57) ABSTRACT

An excessive etch in the conventional manufacturing process causes a roughened surface of a contact bottom, resulting in an increased variation in characteristics of semiconductor devices. A bipolar transistor having a collector region 4 provided in a bottom of a trench formed in a P-type silicon substrate 1 is formed. An interlayer insulating film 23 is formed on the P-type silicon substrate 1. The interlayer insulating film 23 above the trench is partially etched to form a portion 30 of an opening for a collector contact. The interlayer insulating film 23 above the trench is partially etched until reaching the bottom thereof to form a residual section 32 of the opening for the collector contact. The residual section 32 of the opening for the collector contact is formed simultaneously with forming an opening 25 for an emitter contact and an opening 27 for a base contact.

6 Claims, 6 Drawing Sheets

METHOD FOR MANUFACTURING SEMICONDUCTOR DEVICE

This application is based on Japanese patent application No. 2006-172,813, the content of which is incorporated hereinto by reference.

BACKGROUND

1. Technical Field

The present invention relates to a method for manufacturing a semiconductor device.

2. Related Art

A higher level of integration has been generally required for conventional bipolar transistors and bipolar complementary metal oxide semiconductor (BiCMOS) transistors, resulting in progressing miniaturizations of devices. A trench-type collector section is employed for the bipolar collector section to prevent a diffusion in a collector $N^+$ buried layer, allowing higher levels of the miniaturizations. On the other hand, miniaturizations are also progressed in contact sizes, and thus contacts having smaller diameter but larger depth are required to be formed. The contact of the trench type collector is generally required to be formed to have larger depth by the additional depth of the trench, and thus a process that is capable of providing formations of contacts with higher dimensional accuracy without causing a deviation in the characteristics of the obtained devices is required.

A typical BiCMOS transistor having a trench type collector is described in Japanese Patent Laid-Open No. H11-17,040 (1999). A method for manufacturing such BiCMOS transistor will be described in reference to FIG. 6A to FIG. 6C. First of all, as shown in FIG. 6A, a bipolar transistor having a trench type collector and a complementary metal oxide semiconductor (CMOS) transistor are formed on a p-type silicon substrate 101. A depth of the trench of the collector from the substrate surface is selected to be within a range of from 400 to 500 nm.

The bipolar transistor includes an $N^+$ collector region 104, an $N^+$ emitter region 112, a P-type base region 111 and a $P^+$ graft base 108, which are formed on an N-well region 102. The $N^+$ collector region 104 is provided to a bottom of the trench formed in a P-type silicon substrate 101. Further, an emitter polysilicon 119 is coupled to the $N^+$ emitter region 112.

A CMOS transistor is composed of an N-channel field effect transistor (FET) and a P-channel FET. The N-channel FET includes an $N^+$ source drain 107 and an N-type lightly doped drain (LDD) layer 110, which are formed in the P-well region 103, and a gate oxide film 113, a gate polysilicon 114 and a gate electrode 115, which are formed on the P-type silicon substrate 101. The P-channel FET includes a $P^+$ source drain 106 and a P-type LDD-layer 109, which are formed in the P-well region 102, and the gate oxide film 113, the gate polysilicon 114 and the gate electrode 115, which are formed in the P-type silicon substrate 101.

Surfaces of the above-described $N^+$ collector region 104, the $P^+$ graft base 108, the $N^+$ source drain 107, the $P^+$ source drain 106 and the gate electrode 115 are silicidized to form silicide layers 121. Further, the bipolar transistor, the N-channel FET and the P-channel FET are isolated from each other by an element isolation oxide film 105.

A nitride film 122 having a thickness of about 50 to 100 nm and an interlayer insulating film 123 having a thickness of about 500 nm are formed on the P-type silicon substrate 101, which is provided with the above-described bipolar transistors and the CMOS transistors.

Next, as shown in FIG. 6B, a resist 124 is applied on the entire surface thereof. Subsequently, as shown in FIG. 6C, an opening 126 for a collector contact, an opening 125 for an emitter contact, an opening 127 for a base contact and an opening 128 for a CMOS contact are simultaneously formed by a mask-patterning and an etch processes. As described above, the contact section of the BiCMOS transistor having the trench type collector can be obtained.

Other related art documents include Japanese Patent Laid-Open No. H11-265,953 (1999), in addition to the above-described Japanese Patent Laid-Open No. H11-17,040.

However, the present inventor found out the subjects described below.

When an etch process is performed to form the opening 126 for the collector contact in the manufacturing process illustrated in FIG. 6A to FIG. 6C, the openings for other contacts (i.e., the opening 125 for the emitter contact, the opening 127 for the base contact and the opening 128 for the CMOS contact) are excessively etched by at least the depth of the trench. Such excessive etch causes a roughened surface of the contact bottom, resulting in an increased variation in the characteristics of the semiconductor devices.

SUMMARY

According to one aspect of the present invention, there is provided a method for manufacturing a semiconductor device, comprising: forming a bipolar transistor, having a collector region provided in a bottom of a trench formed in a semiconductor substrate; forming an interlayer insulating film on the semiconductor substrate having the bipolar transistor formed therein; partially etching the interlayer insulating film above the trench to form a portion of an opening for a collector contact of the bipolar transistor; and etching the interlayer insulating film above the trench until reaching the bottom to form the residual section of the opening for the collector contact, wherein the residual section of the opening for the collector contact is formed simultaneously with forming an opening for an emitter contact and an opening for a base contact of the bipolar transistor.

In the method for manufacturing the semiconductor device, a portion of the opening for the collector contact is formed by partially etching the interlayer insulating film before forming the opening for the emitter contact and the opening for the base contact. This allows reducing the time required for the etch process, even if the etch process is proceeded until reaching the bottom of the trench when the residual section of the opening for the collector contact is formed, since the etching of the opening for the collector contact is preliminarily performed, so that the level of the excessive etching in the openings for the contacts except the opening for the collector contact can be reduced.

According to the present invention, a method for manufacturing the semiconductor devices exhibiting a reduced variation in the device characteristics can be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations of methods for manufacturing semiconductor devices according to the present invention will be described in reference to the annexed figures. In all figures, identical numeral is assigned to an element commonly appeared in the description of the present invention in reference to the figures, and the detailed description thereof will not be repeated.

First Embodiment

Figure 1A:
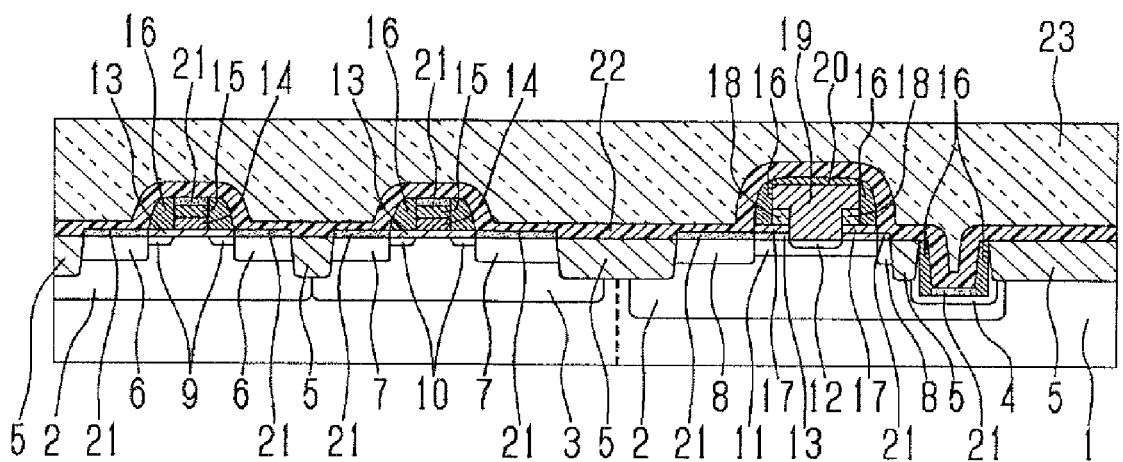
FIGS. 1A and 1B are cross-sectional views of a semiconductor device, illustrating a process for manufacturing a semiconductor device in first embodiment according to the present invention.

First embodiment of a method for manufacturing a semiconductor device according to the present invention will be described in reference to FIGS. 1A and 1B and FIGS. 2A and 2B. First of all, as shown in FIG. 1A, a bipolar transistor having a trench type collector and a CMOS transistor are formed on a P-type silicon substrate 1 by a known method. Depth of the trench of collector is, for example, about 400 to 500 nm from a surface of the substrate.

The bipolar transistor includes an N$^+$ collector region 4, an N$^+$ emitter region 12, a P-type base region 11 and a P$^+$ graft base 8, which are formed in an N-well region 2. The N$^+$ collector region 4 is provided in a bottom of a trench formed in the P-type silicon substrate 1. Further, an emitter polysilicon 19 is coupled to the N$^+$ emitter region 12. A periphery of the emitter polysilicon 19 is provided with an oxide film 17 and a polysilicon 18.

The CMOS transistor includes both of an N-channel FET and a P-channel FET. The N-channel FET includes an N$^+$ source drain 7 and an N-type LDD layer 10, which are formed in a P-well region 3, and a gate oxide film 13, a gate polysilicon 14 and a gate electrode 15, which are formed on the P-type silicon substrate 1. The P-channel FET includes a P$^+$ source drain 6 and a P-type LDD layer 9, which are formed in the N-well region 2, and the gate oxide film 13, the gate polysilicon 14 and the gate electrode 15, which are formed on the P-type silicon substrate 1.

Surfaces of the above-described N$^+$ collector region 4, the P$^+$ graft base 8, the N$^+$ source drain 7, the P$^+$ source drain 6 and the gate electrode 15 are silicidized to form silicide layers 21. Side surfaces of the above-described trench, side surfaces of the emitter polysilicon 19 and side surfaces of the gate electrode 15 are provided with side wall oxide films 16 formed thereon. Further, the bipolar transistor, the N-channel FET and the P-channel FET are isolated by an element isolation oxide film 5.

A nitride film 22 and an interlayer insulating film 23 are sequentially deposited on the P-type silicon substrate 1, which is provided with the bipolar transistor and the CMOS transistor formed therein. The thickness of the nitride film 22 and the interlayer insulating film 23 are, for example, about 50 to 100 nm and about 500 nm, respectively.

Figure 1B:
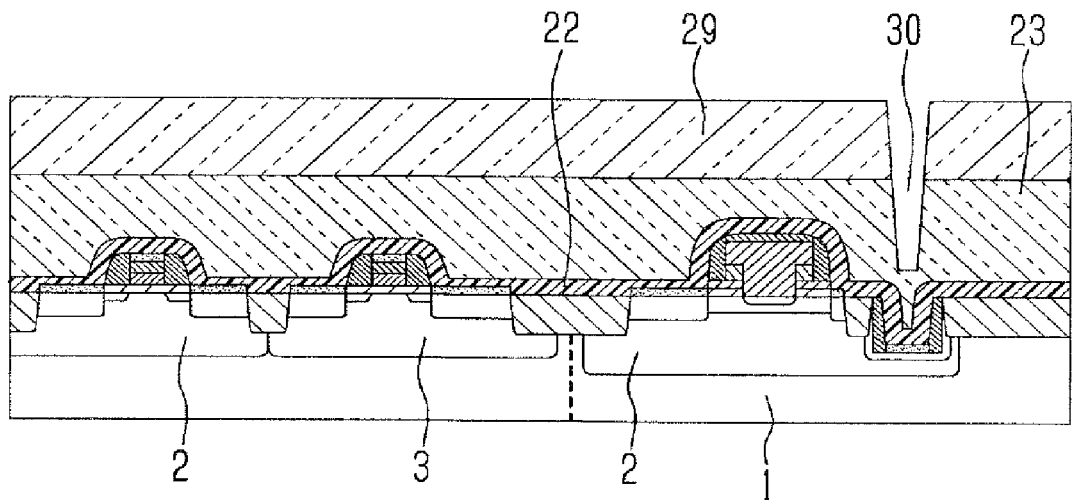

Next, as shown in FIG. 1B, a resist film 29 is applied on the interlayer insulating film 23. This resist film 29 is patterned, and then, the patterned resist film is employed as a mask for an etch process to partially etch the interlayer insulating film 23 above the above-described trench partway. In other words, the etching is performed to a depth that does not reach the bottom of the trench. For example, the etching is performed to a depth of about 400 nm from an uppermost surface of the interlayer insulating film 23. This provides forming a portion 30 of the opening for the collector contact.

Figure 2A:
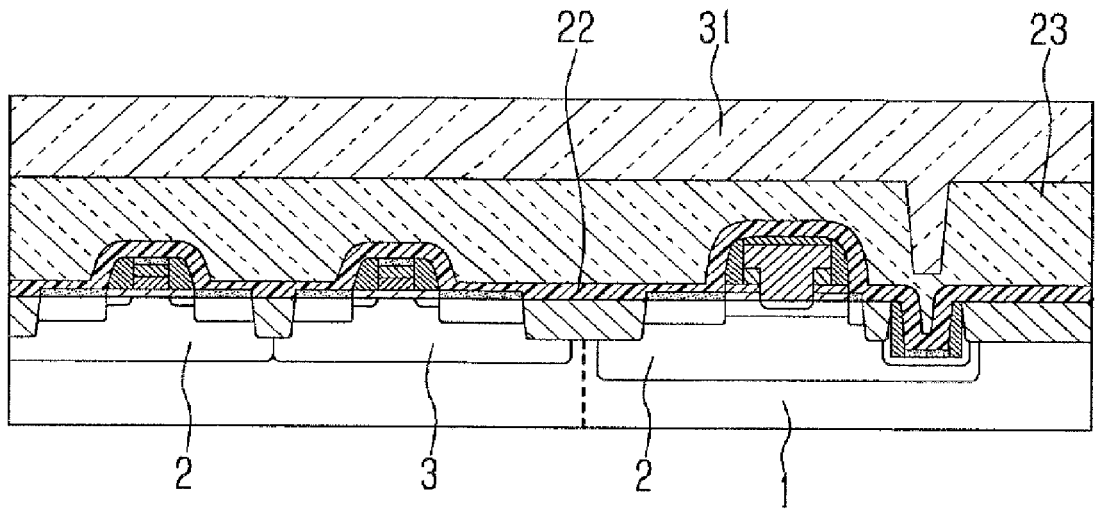
FIGS. 2A and 2B are cross-sectional views of the semiconductor device, illustrating the process for manufacturing the semiconductor device in first embodiment according to the present invention.
Figure 2B:
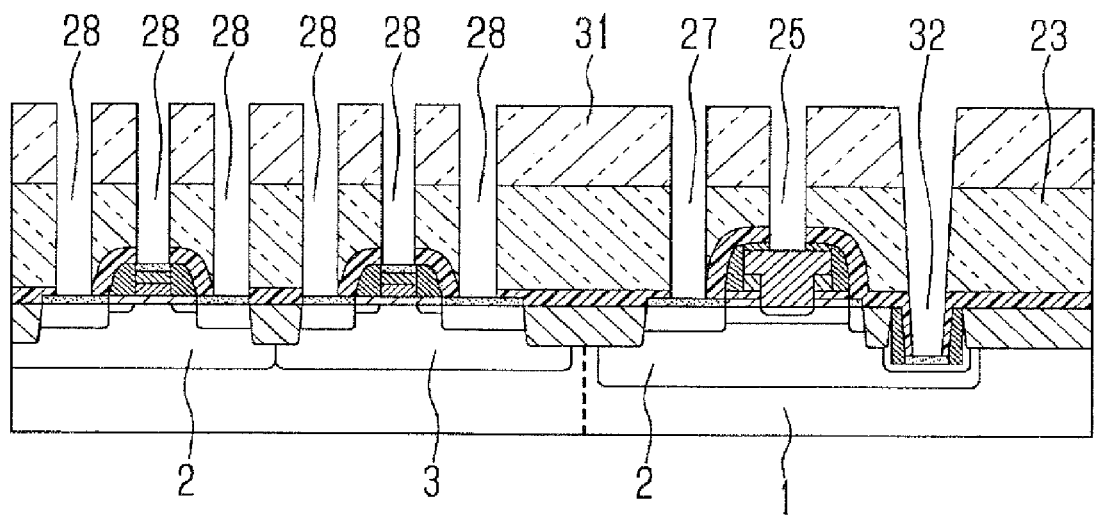

Subsequently, as shown in FIG. 2A, the resist film 29 is removed, and then, a resist film 31 is applied on the entire surface of the interlayer insulating film 23. As shown in FIG. 2B, such resist film 31 is patterned, and then, the patterned resist film is employed as a mask for an etch process to etch the interlayer insulating film 23 above the above-described trench until reaching the bottom of the trench. At this time, etching process for sections where the emitter contact, the base contact and the CMOS contact are formed are also simultaneously performed. This allows simultaneously forming the residual section 32 of the opening for the collector contact, the opening 25 for the emitter contact, the opening 27 for the base contact and the opening 28 for the CMOS contact. In addition to above, the opening 28 for the CMOS contact incorporates, more specifically, an opening for a source contact of the CMOS transistor, an opening for the gate contact and an opening for the drain contact. Thereafter, the resist film 31 is removed, and contact plugs (not shown) are plugged within the respective openings for contacts to obtain the semiconductor device.

Advantageous effects obtainable by employing of the configuration of the present embodiment will be described. In the above-described manufacturing process, the interlayer insulating film 23 is partially etched to form a portion 30 of the opening for the collector contact, before forming the opening 25 for the emitter contact, the opening 27 for the base contact and the opening 28 for the CMOS contact. This allows reducing the process time for the etch process, even if the etch process is proceeded until reaching the bottom of the trench when the residual portions 32 of the opening for the collector contact is formed, since the etching of the opening for the collector contact is preliminarily performed, so that the level of the excessive etching in the openings 25, 27 and 28 for the contacts except the opening for the collector contact can be reduced. Thus, the level of the roughened surface in the contact bottom due to the excessive etching can be reduced, thereby reducing the variation in the characteristics of the device.

Typical examples of the roughened surface in the contact bottom includes: a reduced thickness of or a complete removing of, the silicide layer 21 that has been formed for providing lower resistance. When the silicide layer 21 is thinned or alternatively removed, an increase in the contact resistance or an increase in the variation may also be caused. According to the present embodiment, such increase in the contact resistance or such increase in the variation can be inhibited.

Second Embodiment

Figure 3A:
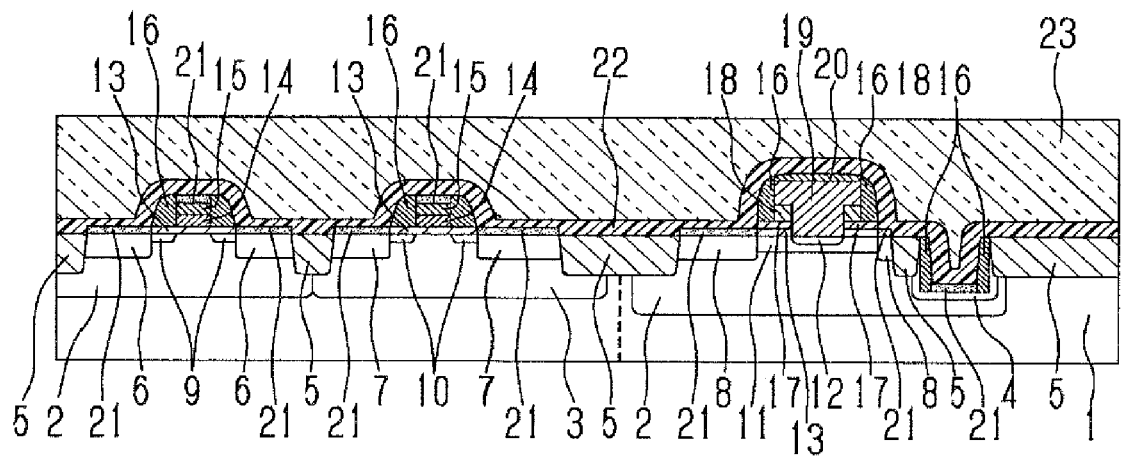
FIGS. 3A and 3B are cross-sectional views of a semiconductor device, illustrating a process for manufacturing a semiconductor device in second embodiment according to the present invention.

Second embodiment of a method for manufacturing a semiconductor device according to the present invention will be described in reference to FIGS. 3A and 3B, FIGS. 4A and 4B and FIGS. 5A and 5B. First of all, as shown in FIG. 3A, a bipolar transistor and a CMOS transistor are formed on a P-type silicon substrate 1 by a known method, and then, a nitride film 22 and an interlayer insulating film 23 are sequentially deposited thereon. In addition to above, the constitutions of the bipolar transistor and the CMOS transistor are as described in reference to FIG. 1A.

Figure 3B:
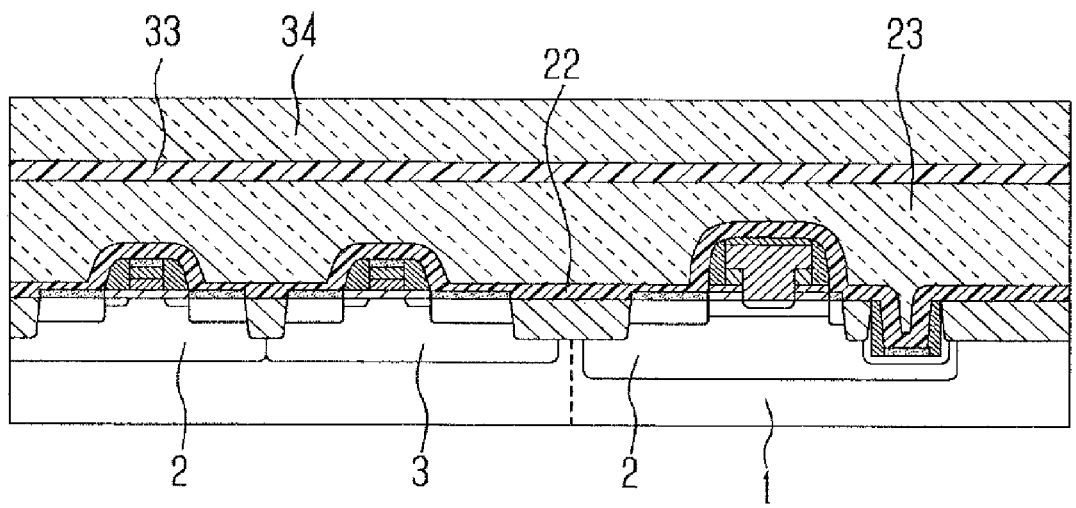
Figure 4A:
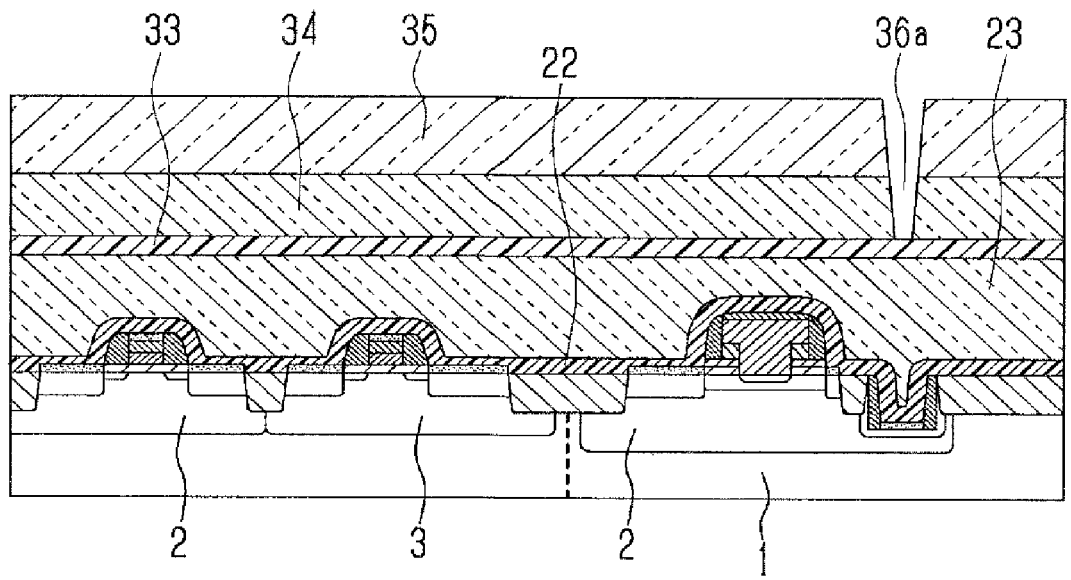
FIGS. 4A and 4B are cross-sectional views of the semiconductor device, illustrating the process for manufacturing the semiconductor device in second embodiment according to the present invention.

Next, as shown in FIG. 3B, an etch stop film 33 such as a nitride film and an insulating film 34 for mask are sequentially formed on the interlayer insulating film 23. The insulating film 34 for mask is composed of a material that is same as the material of the interlayer insulating film 23. Thickness of etch stop film 33 and insulating film 34 for a mask are, for example, about 50 nm and about 400 nm, respectively. Subsequently, as shown in FIG. 4A, a resist film 35 is applied on the interlayer insulating film 23. Such resist film 35 is patterned, and then, the patterned resist film is employed as a mask for an etch process to etch the interlayer insulating film 34 above the above-described trench until reaching the etch stop film 33. This process allows forming an opening 36a.

Figure 4B:
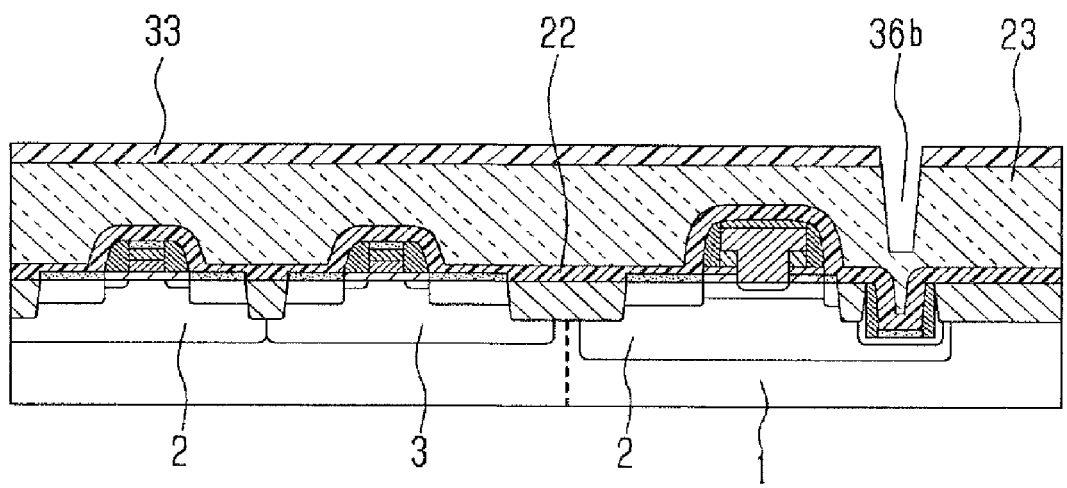

Next, as shown in FIG. 4B, the resist film 35 is removed, and then, the insulating film 34 for the mask having the opening 36a formed therein is employed as a mask for an etch process to partially etch the interlayer insulating film 23 above the trench partway. This allows a portion 36b of the opening for the collector contact formed therein. At this time, the etch process is stopped at a point when the etch stop film 33 is exposed, by utilizing an etching end point. Having such procedure, the etching can be performed with higher accuracy until the etching is proceeded to the depth equivalent to the thickness of the insulating film 34 for a mask. For example, when the insulating film 34 for a mask is deposited to a thickness of about 400 nm, the depth of the portion 36b of the opening for the collector contact formed therein is about 400 nm.

Figure 5A:
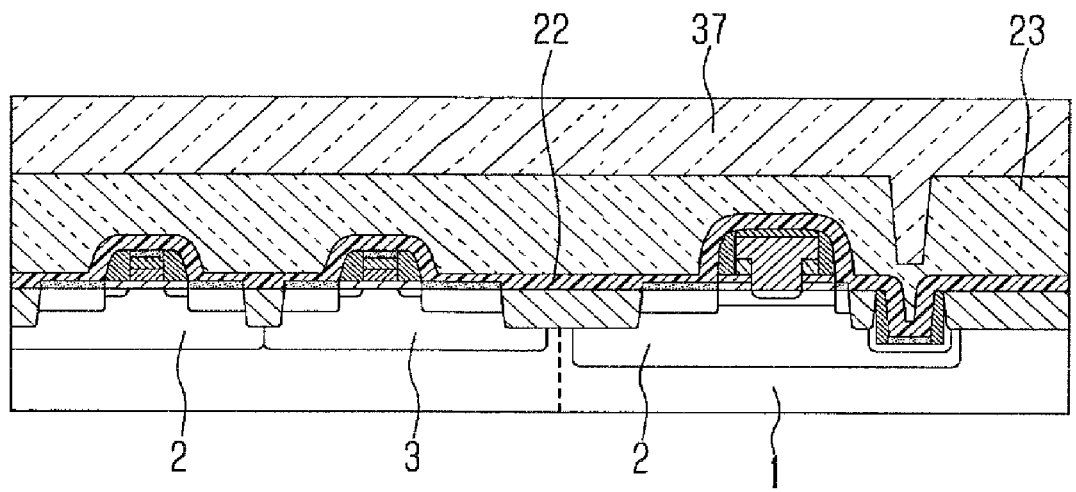
FIGS. 5A and 5B are cross-sectional views of the semiconductor device, illustrating the process for manufacturing the semiconductor device in second embodiment according to the present invention.
Figure 5B:
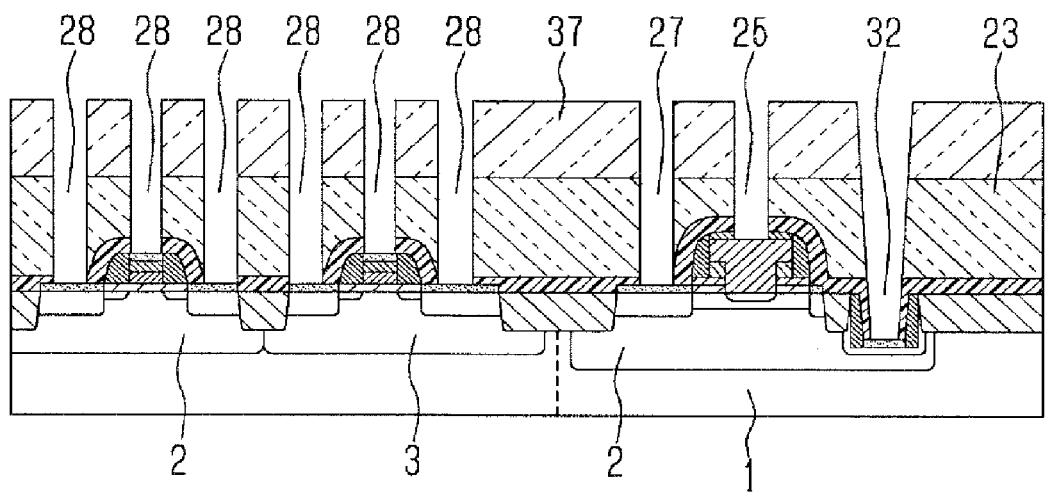
Figure 6A:
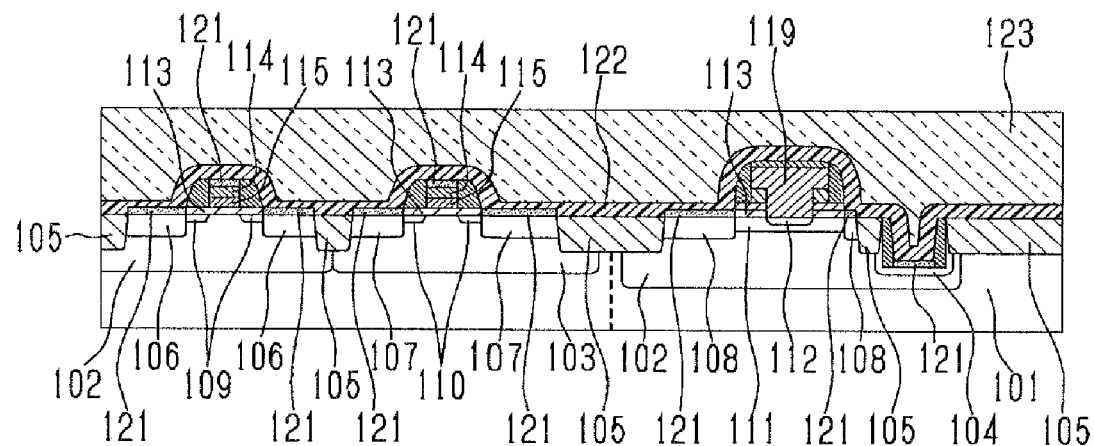
FIGS. 6A to 6C are cross-sectional views of a semiconductor device, illustrating a conventional process for manufacturing a semiconductor device.
Figure 6B:
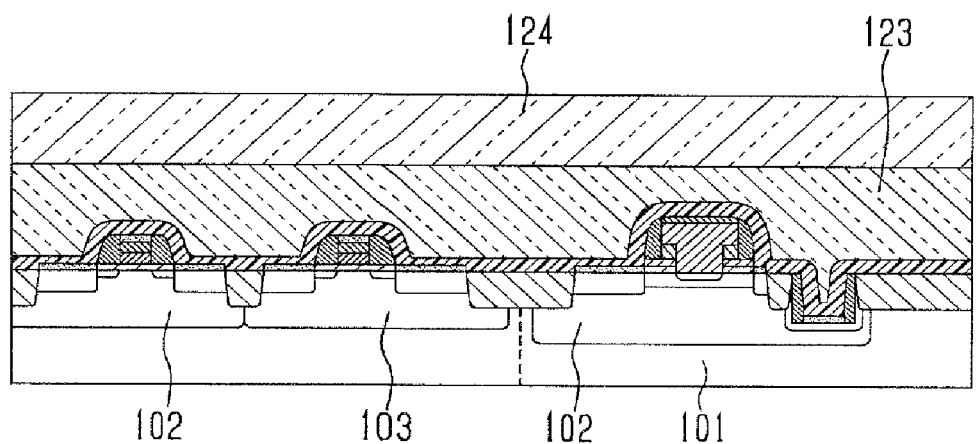
Figure 6C:
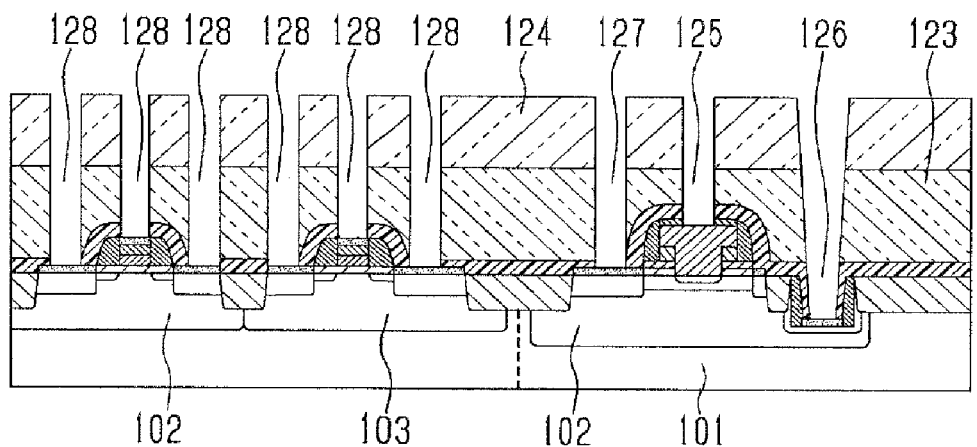

Next, as shown in FIG. 5A, the etch stop film 33 is removed by the etching of the entire surface, and then a resist film 37 is applied on the entire surface of the interlayer insulating film 23. As shown in FIG. 5B, such resist film 37 is patterned, and then the patterned resist film is employed as a mask for an etch process to etch the interlayer insulating film 23 to simultaneously form the residual section 32 of the opening for the collector contact, the opening 25 for the emitter contact, the opening 27 for the base contact and the opening 28 for the CMOS contact. Thereafter, the resist film 37 is removed, and contact plugs (not shown) are plugged within the respective openings for contacts to obtain the semiconductor device.

In the present embodiment, the etching is performed through a mask of the insulating film 34 for mask, and the etching process can be stopped by detecting the etching end point when the etch stop film 33 is exposed. This allows etching the interlayer insulating film 23 by only the thickness of the insulating film 34 for mask without being influenced by the etch rate of the etch process. Therefore, according to the configuration of the present embodiment, the depth of the portion 36b of the opening for the collector contact can be controlled with higher accuracy. The other advantageous effects of the present embodiment are similar to that of first embodiment.

It is not intended that the methods for manufacturing the semiconductor devices according to the present invention are limited to the configurations illustrated in the above-described embodiments, and thus various modifications thereof are also available. For example, while the exemplary implementations having the bipolar transistor and the CMOS transistor provided in the semiconductor substrates have been illustrated in the above-described embodiments, only the bipolar transistors may alternatively be provided thereto.

Further, while the exemplary implementations having both of the N-channel and the P-channel FETs provided thereto have been illustrated in the above-described embodiments, only one of these FETs may alternatively be provided thereto.

Moreover, the conductivity types in respective members indicated in the above-described embodiments are for only illustrations, and the conductivity type in each member may alternatively be changed. For example, an N-type silicon substrate may be employed in place of the P-type silicon substrate 1.

It is apparent that the present invention is not limited to the above embodiment, and may be modified and changed without departing from the scope and spirit of the invention.

What is claimed is:

1. A method for manufacturing a semiconductor device, comprising:
    forming a bipolar transistor, having a collector region provided in a bottom of a trench formed in a semiconductor substrate;
    forming an interlayer insulating film on said semiconductor substrate having said bipolar transistor formed therein;
    partially etching said interlayer insulating film above said trench to form a portion of an opening for a collector contact of said bipolar transistor; and
    etching said interlayer insulating film above said trench until reaching said bottom to form a residual section of said opening for the collector contact,
    wherein said residual section of said opening for the collector contact is formed simultaneously with forming an opening for an emitter contact and an opening for a base contact of said bipolar transistor.

2. The method for manufacturing the semiconductor device as set forth in claim 1, further comprising:
    forming a resist film on said interlayer insulating film having said portion of said opening for the collector contact,
    wherein said residual section of said opening for the collector contact, said opening for the emitter contact and said opening for the base contact are formed by an etch process through a mask of said resist film.

3. The method for manufacturing the semiconductor device as set forth in claim 1, further comprising:
    forming an insulating film for mask on said interlayer insulating film through an etch stop film; and
    etching said insulating film for mask above said trench until reaching said etch stop film,
    wherein said portion of said opening for the collector contact is formed by an etch process through a mask of said insulating film for mask, which is formed by etching the portion thereof above said trench.

4. The method for manufacturing the semiconductor device as set forth in claim 3, wherein said insulating film for mask is composed of a material, which also composes said interlayer insulating film.

5. The method for manufacturing the semiconductor device as set forth in claim 1, further comprising:
    forming a field effect transistor in said semiconductor substrate,
    wherein said residual section of said opening for the collector contact is formed simultaneously with forming said opening for the source contact of the field effect transistor, said opening for the gate contact and said opening for the drain contact.

6. The method for manufacturing the semiconductor device as set forth in claim 5, wherein both of an N-channel field effect transistor and a P-channel field effect transistor are formed as said field effect transistors.

* * * * *